United States Patent
Haddad et al.

(10) Patent No.: US 10,404,447 B1
(45) Date of Patent: Sep. 3, 2019

(54) CLOCK RECOVERY DEVICE WITH STATE MACHINE CONTROLLER

(71) Applicant: Microsemi Semiconductor ULC, Kanata (CA)

(72) Inventors: Tariq Haddad, Ottawa (CA); Xihao Li, Ottawa (CA); Robert Friesen, Ottawa (CA)

(73) Assignee: MICROSEMI SEMICONDUCTOR ULC, Kanata (CA)

( * ) Notice: Subject to any disclaimer, the term of this patent is extended or adjusted under 35 U.S.C. 154(b) by 0 days.

(21) Appl. No.: 16/058,015

(22) Filed: Aug. 8, 2018

Related U.S. Application Data

(60) Provisional application No. 62/689,855, filed on Jun. 26, 2018.

(51) Int. Cl.
```
H04L 7/033     (2006.01)
H03L 7/099     (2006.01)
H03L 7/08      (2006.01)
```

(52) U.S. Cl.
CPC .......... *H04L 7/0331* (2013.01); *H03L 7/0807* (2013.01); *H03L 7/099* (2013.01)

(58) Field of Classification Search
CPC ..... H03L 7/0995; H03L 7/0807; H03L 7/099; H04L 7/0331
See application file for complete search history.

(56) References Cited

U.S. PATENT DOCUMENTS

| | | | |
|---|---|---|---|
| 7,689,854 B2 | 3/2010 | Ilnicki et al. | |
| 2005/0002403 A1* | 1/2005 | Roberts | H04J 3/076 370/395.51 |
| 2014/0320186 A1* | 10/2014 | Jin | H03L 7/1075 327/159 |
| 2018/0091291 A1 | 3/2018 | Haddad et al. | |

OTHER PUBLICATIONS

"Monitoring Standby PTP Connections", Application Note ZLAN-632, Microsemi Corporate Headquarters, One Enterprise, Aliso Viejo, CA 92656, Dec. 2016.

Andreas, et al., "Precision Clock Synchronization the Standard IEEE 1588", White Paper, Rev. 1.2, Hirschmann Automation and Control GmbH, Neckartenzlingen, Germany.

* cited by examiner

*Primary Examiner* — Sung S Ahn
(74) *Attorney, Agent, or Firm* — Glass and Associates; Kenneth Glass

(57) ABSTRACT

A clock recovery device recovers frequency and timing information from an incoming packet stream over asynchronous packet networks. A phase locked loop (PLL) block has predefined states and includes a type II PLL. One of the states involves type II PLL operation. A state machine controller for controls the transition between the predefined states in response to changes in the incoming packet stream. A controlled oscillator is responsive to the PLL block to generate an output signal.

20 Claims, 11 Drawing Sheets

CLOCK RECOVERY DEVICE WITH STATE MACHINE CONTROLLER

CROSS REFERENCE TO RELATED APPLICATION

This application claims the benefit under 35 USC 119(e) of U.S. provisional application No. 62/689,855, filed Jun. 26, 2018, the contents of which are herein incorporated by reference.

FIELD OF THE INVENTION

This invention relates to the field of precision clock recovery in packet networks, for example, in networks implementing the Precision Time Protocol (PTP) described by IEEE Standard for a Precision Clock Synchronization Protocol for Networked Measurement and Control Systems, IEEE Std. 1588TM-2008, 24 Jul. 2008 (hereinafter referred to as 1588), the contents of which are herein incorporated by reference. The invention particularly relates to a clock recovery device for recovering frequency and timing information from an incoming packet stream over asynchronous networks. The invention is applicable to Ethernet networks, but may also be applied to other networks, such as Internet Protocol (IP) networks. The invention is particularly applicable to a clock recovery device as described in US patent publication no. 2018/0091291, entitled Clock Recovery Device with Switchable Transient Non-Linear Phase Adjuster", the contents of which are herein incorporated by reference.

BACKGROUND OF THE INVENTION

PTP is used to synchronize a master clock with slave clocks where extreme precision is required, such as in advanced control or cellular communications systems. Where there are a number of potential master clocks, a best master clock algorithm may select the best clock to use as the master based on predetermined requirements. The selected clock is known as the grand master.

As described in the IEEE 1588 standard referenced above, PTP makes use of timestamped synchronization packets to carry timing information over the network to the receiver, where a physical clock signal is recovered using a phase locked loop driving a digitally controlled oscillator. An exemplary prior art PTP clock recovery system is described in U.S. Pat. No. 7,689,854, published Mar. 30, 2010, the contents of which are herein incorporated by reference. Further details are provided in a White Paper by Hirschmann entitled Precision Clock Synchronization—The Standard IEEE 1588, Rev. 1.2, available from Industrial Networking Solutions, Addison, Tex.

Clock recovery often takes place at the boundary between networks. The requirements for boundary clocks are described by ITU recommendation G.8273.2. Prior art clock recovery devices may not be able to meet the extremely strict requirements of the aforementioned ITU recommendation with regard to the ability to reduce residual phase error when used as boundary clocks. In particular, the use of a conventional phase locked loop (PLL) architecture in network synchronization applications is not possible due to the nature and format of the time transport layer. Any overall solution should aim to satisfy certain limits with respect to:
Initial frequency and phase lock interval
Frequency error after frequency lock declaration
Frequency drift after frequency lock declaration
Phase error after phase lock declaration
MTIE (Maximum Time Interval Error) relative to calculation interval
TDEV (Time Deviation) relative to calculation interval
Holdover performance and enter/exit criteria In addition to the meeting those limits the solution should aim to be flexible enough to support the following system requirements:
Warm start of servers with given frequency offset
Tolerance and recovery from frequency/phase jumps
Tolerance and recovery from network downtime scenarios
Transient mitigation for loss of reference
Active/Monitor server frequency and phase lock declarations
Reference switching between active and monitor server references (reference denotes PTP reference in this case)
Mode switching between active and monitor server reference (reference denotes PTP reference in this case, servers may have different modes of operation)
Mode switching between PTP server and electrical frequency/phase sources

SUMMARY OF THE INVENTION

Embodiments of the invention provide a controller implementing a state machine that provides a seamless transition between the different system conditions while maintaining the required clock limits. In one embodiment, the state machine architecture controls the transition between normal PLL locking, step time operation, monitoring, holdover and fast phase and frequency locking. In particular the state controller transitions between known 1588 server phase and frequency states in order to facilitate the use of conventional PLL architecture to provide a G.8273.1, G.8273.2 and/or G.8273.3-grade clock for full on-path support 1588 synchronization. Embodiments of the invention perform ultra-fast locking with a large time offset between master and server nodes serviced by clock recovery devices in accordance with the invention.

The use of a state machine controller in accordance with embodiments of the invention, which puts the PLL block into a particular state in response to changes in the PTP input stream, allow the use of a conventional type-II PLL. A type II PLL as defined herein has a loop filter wherein the PLL phase difference is applied to the inputs of two paths, the outputs of which are summed to provide a control input for a numerically controlled oscillator (NCO) or a digitally controlled oscillator (DCO). The first path is a proportional path, which applies a scaling factor to the output of the low pass filter, and the second path contains an integrator, which operates on the PLL input phase difference. The use of a type II PLL has considerable advantages in terms of reduced complexity and final fixed frequency offset that corresponds to zero input phase.

According to the present invention there is provided a clock recovery device for recovering frequency and timing information from an incoming packet stream over asynchronous packet networks, comprising a phase locked loop (PLL) block having a plurality of predefined states, said PLL block including a type II PLL, one of said states including type II PLL operation; a state machine controller for controlling the transition between said predefined states in response to changes in the incoming packet stream; and a controlled oscillator responsive to said PLL block for generating an output signal.

In accordance with embodiments of the invention minimal packet filtering is required for full on-path support boundary clocks, a phase interface block may used to compute the offset from master using both Sync and Delay-Req timestamps as <offsetFromMaster>=<syncEventIngressTimestamp>-<origin Timestamp>-<meanPathDelay>, and time of day functions including a StepTime function may be used to align time/phase information within a programmable threshold before the PLL starts a locking operation.

Embodiments of the invention permit the use of a multi-stage PLL targeted for ultra fast convergence of very large initial phase offsets (represented by 48 bits), with parallel frequency convergence and permit the removal of local phase discontinuities in the feedback path without affecting the closed loop frequency transfer function.

According to another aspect of the invention there is provided a computer implemented method of recovering frequency and timing information from an incoming packet stream over asynchronous packet networks, comprising the steps of: providing a phase locked loop (PLL) block having a plurality of predefined states, said PLL block including a type II PLL, one of said states including type II PLL operation; controlling the transition between said predefined states in response to changes in the incoming packet stream; and generating an output signal with a controlled oscillator responsive to said PLL block.

BRIEF DESCRIPTION OF THE DRAWINGS

This invention will now be described in more detail, by way of example only, with reference to the accompanying drawings, in which.

DETAILED DESCRIPTION OF PREFERRED EMBODIMENTS

Figure 1:
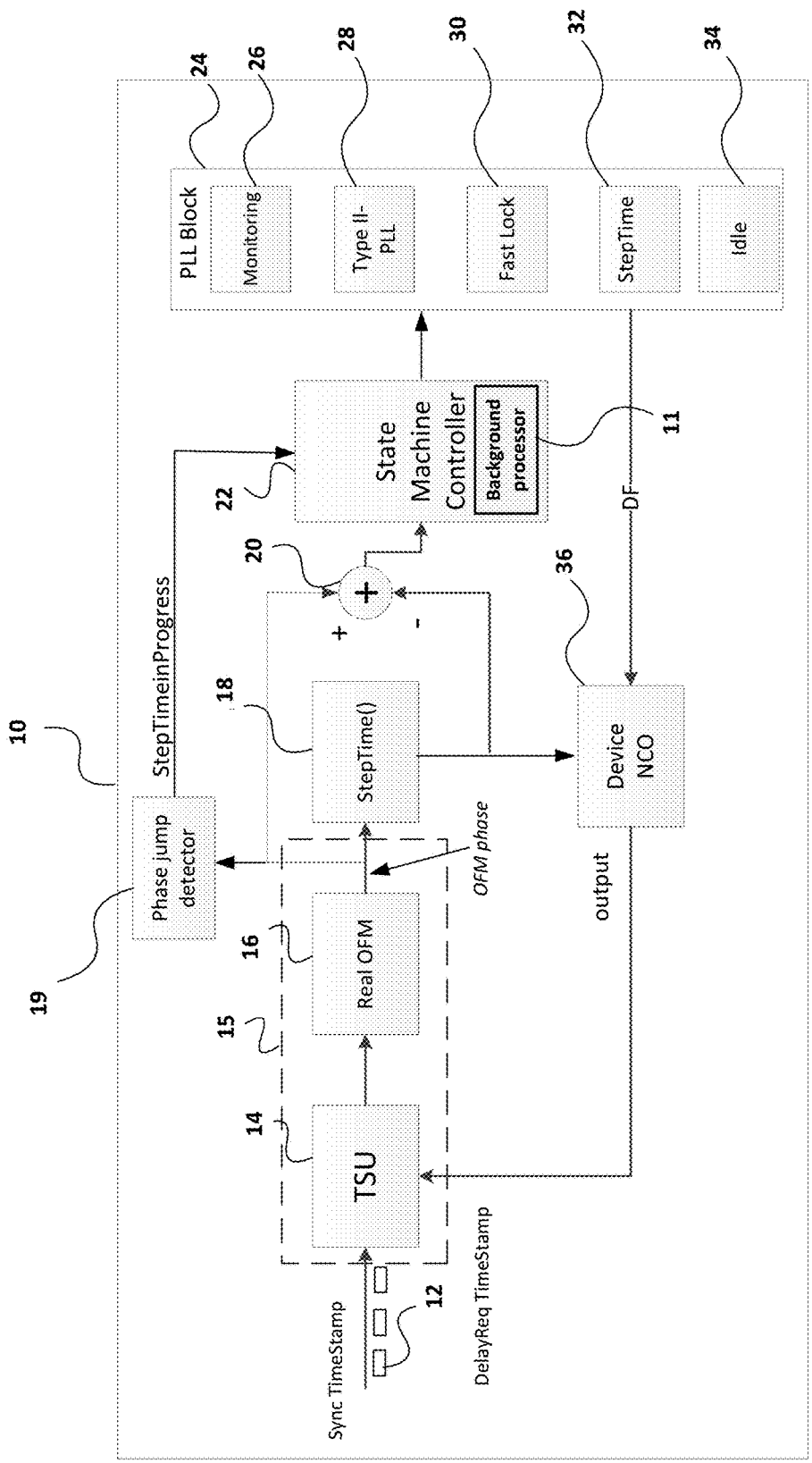
FIG. 1 is a top level system diagram of a clock recovery device incorporating a state machine controller in accordance with an embodiment of the invention.

By way of non-limiting example a clock recovery device 10 shown in FIG. 1 may implement the IEEE Standard for a Precision Clock Synchronization Protocol for Networked Measurement and Control Systems, IEEE Std. 1588TM-2008, 24 Jul. 2008. This protocol allows the recovery of timing and frequency information over asynchronous packet networks as is well known in the art.

The clock recovery device 10, serving as a slave clock, receives a stream 12 of incoming time stamped packets denoted Sync TimeStamp from a remote master clock (not shown) at the input of a timestamp unit (TSU) 14 in a phase interface block 15 comprising the timestamp unit (TSU) 14 and a real OFM (offset from master) block 16. The TSU 14 also creates delay request packets denoted DelReq TimeStamp, which are timestamped based on the output of numerical controlled oscillator (NCO) 36, which NCO 36 generates the output of the clock recovery device 10.

The real OFM block 16 computes the offset from master (OFM phase) using both SyncEventingress TimeStamp and DelReq TimeStamp timestamps as <offsetFromMaster>=<syncEventIngressTimestamp>-<origin Timestamp>-<meanPathDelay>, where syncEventIngressTimestamp is the timestamp applied to the arriving packets and meanPathDelay is obtained from the DelReq TimeStamps returned by the master.

The output phase of the real OFM block 16, OFM phase, is fed to a StepTime( ) block 18. Time/phase information is stored in the NCO 36, which time/phase information determines the current output of the NCO 36 or shifts the output phase of the associated hardware using dedicated phase offset registers. The selection of whether, or not, to shift is hardware dependent. The StepTime( ) block 18 brings the stored time/phase information to within a programmable threshold offset value relative to the output of the OFM block 16 before a PLL block 24 starts locking operation. The output of the real OFM block 16 is further fed to a plus input of adder 20 whose output provides an input to state machine controller 22, which may be implemented in the form of a suitably programmed processor.

The output of real OFM block 16 is also input to a phase jump detector 19, which asserts a StepTimeinProgress flag as TRUE when a detected phase jump in the incoming active PTP stream exceeds a programmable StepTime threshold. The StepTimeinProgress flag serves as a state machine input as shown in FIG. 1 and FIGS. 5 to 7.

The output of StepTime( ) block 18 is fed to an input of the NCO 36 and to the minus input of the adder 20. StepTime( ) block 18 is controlled by an output of state machine controller 22 (not shown).

The state machine controller 22 determines the state of the PLL block 24. The state machine controller 22 also includes a background processor 11, which performs a number of background tasks referred to throughout this description.

The PLL block 24 includes a type II PLL 28, but also performs a number of other different functions to be described, depending on its state. The output of the PLL block 24 provides a frequency difference DF as a control input to the NCO 36.

For the purposes of understanding the invention it is sufficient to know that the PLL block 24 can be in a number of different states, each of which states may be known in the art. Monitoring state 26 is described in detail in Microsemi Application Note ZLAN-632, Monitoring Standby PTP Connections, published by Microsemi Corporation in December 2016, the contents of which are herein incorporated by reference. In monitoring state 26 a fixed 100 mHz filter bandwidth predictive open loop DF estimation mode/filter is enabled as is known in the art.

Figure 9:
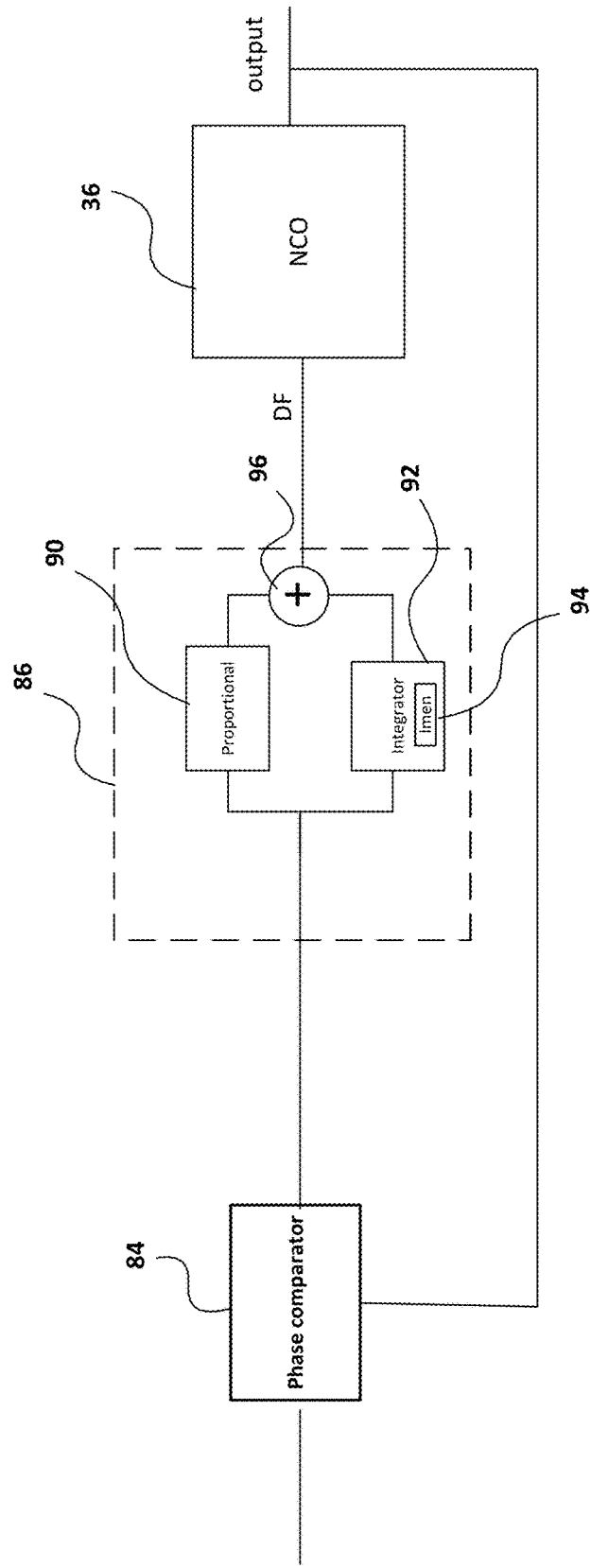
FIG. 9 is a block diagram of an exemplary type II PLL as known in the prior art.

In the type II PLL state 28, the PLL block 24 functions as a typical type II PLL, normally a digital PLL (DPLL). An exemplary type II PLL is shown in FIG. 9 and comprises a phase comparator 84, and a low pass loop filter 86 including a proportional block 90 and an integrator 92 including a memory Imem 94, which holds a scaled value of the frequency offset between master and slave computed by the type II PLL. This scaled value will be controlled as necessary by the other states in block 24 of FIG. 1. The outputs of the proportional block 90 and integrator 92 are summed in adder 96 and applied as a control input DF to NCO 36, which generates the output signal.

As indicated above, the state machine controller 22 determines the state of PLL Block 24 shown in FIG. 1. For example, the state machine controller 22 may set the PLL block 24 to function in type II PLL state 28, which is useful in IEEE 1588 applications. In this state the PLL block 24 locks to the incoming packet stream 12. The state machine controller 22 can be set by command to put PLL block 24 into the type II PLL state 28, which allows the user to test the clock recovery device 10 seamlessly as if it were a simple type-II PLL without the additional states.

The state machine controller 22 triggers additional states following: reference switching; initialization; network disconnection; or frequency or phase (time) jumps on the master or local oscillator as illustrated in the FIGS. 3 to 8, respectively. In some of these states, the phase (time) and frequency may be corrected in a significantly faster manner than in the type II PLL state 28 while the appropriate value is prepared for insertion into the integrator memory Imem 94 (FIG. 9) prior to return to type-II PLL 28 operation. Type-II PLL state 28 operation is considered normal operation and may be so called further below.

In the monitoring state 26 a statistical estimation of the value of Imem 94 is computed given a PTP master and a local NCO 36 controlled by another active stream (not shown). Upon exit from the monitoring state 26 the final frequency offset (DF) value estimated in the monitoring state 26 is inserted into Imem 94.

In fast lock state 30, also referred to as Fastlock, a simple fast phase compensation is enabled by adjusting the frequency of NCO 36 for short periods of time until the input phase is bridged down to the timestamp resolution. The approach is recursive and the maximum value of DF update is controlled by the initial phase offset, number of fastlock iterations as well as a programmable frequency controlled limit. In PLL theory the frequency controlled limit defines the maximum frequency rate of change. In the fast lock state fast phase locking is performed while maintaining a dynamic estimate of the correct value for DF. Again, upon exit from this state, the final DF determined in the fast lock state is loaded into the Imem 94.

The fast lock state is described in more detail below with reference to FIGS. 12 and 13 below.

In StepTime state 32 the NCO 36 and the associated phase-offset hardware is updated in large time steps, based on the offset-from-master and the allowed hardware specific steps in time. Larger steps could be done multiple of times to satisfy hardware restrictions. During this state a background estimate of the current frequency is performed by taking the derivative of the phase to enable the PLL 24 to be properly initialized before moving back into normal PLL operation (or Fastlock). While stepping the time in a time of day register in the NCO, a background function keeps track of any changes to the frequency offset. Upon exit from the StepTime state 32, the final value of DF is loaded into the Imem 94. The background tasks keep a time count of the period spent in time stepping and a value of the input phase. Upon exiting StepTime state 32, this background task will provide the following:

$$phaseDifferenceNs = (Current\ phase) - Starting\ phase + Amount\ of\ time\ steps$$

Then, $DF(in\ ppb) = -(phaseDifferenceNs * 1000) / eclipsedTimeMs$ where eclipsedTimeMs is the step-time period in ms.

The PLL block 24 also has an idle state 34 in which the PLL block 24 is in idle mode wherein none of the other states is active.

Figure 2:
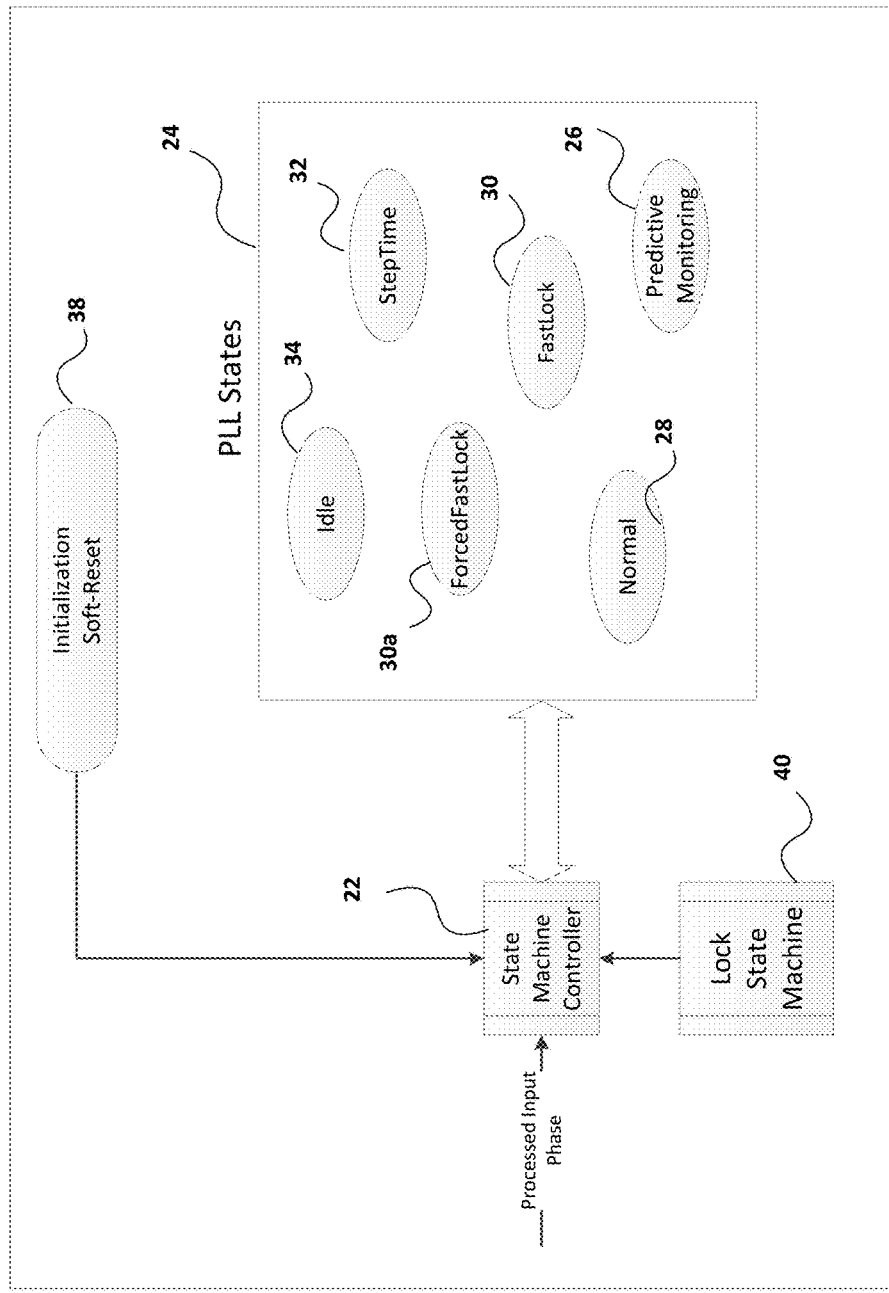
FIG. 2 is a diagram illustrating the top level states of the clock recovery device.

The states are more specifically shown in the state diagram of FIG. 2. The Fastlock state 30 comprises two different potential states: the fast lock state 30 as described above and a ForcedFastLock state 30a wherein the fastlock is entered regardless of the input phase threshold.

The state machine controller 22 determines the current state in response to input phase from adder 20 and a soft reset command from block 38. The lock-state machine block 40, which does not form part of the invention, acts as a supervisor informing block 24 of the lock status of the over-all system. As long as the system is in lock condition a normal mode of PLL operation is maintained in state 28, otherwise the system operates as described below.

Figure 3:
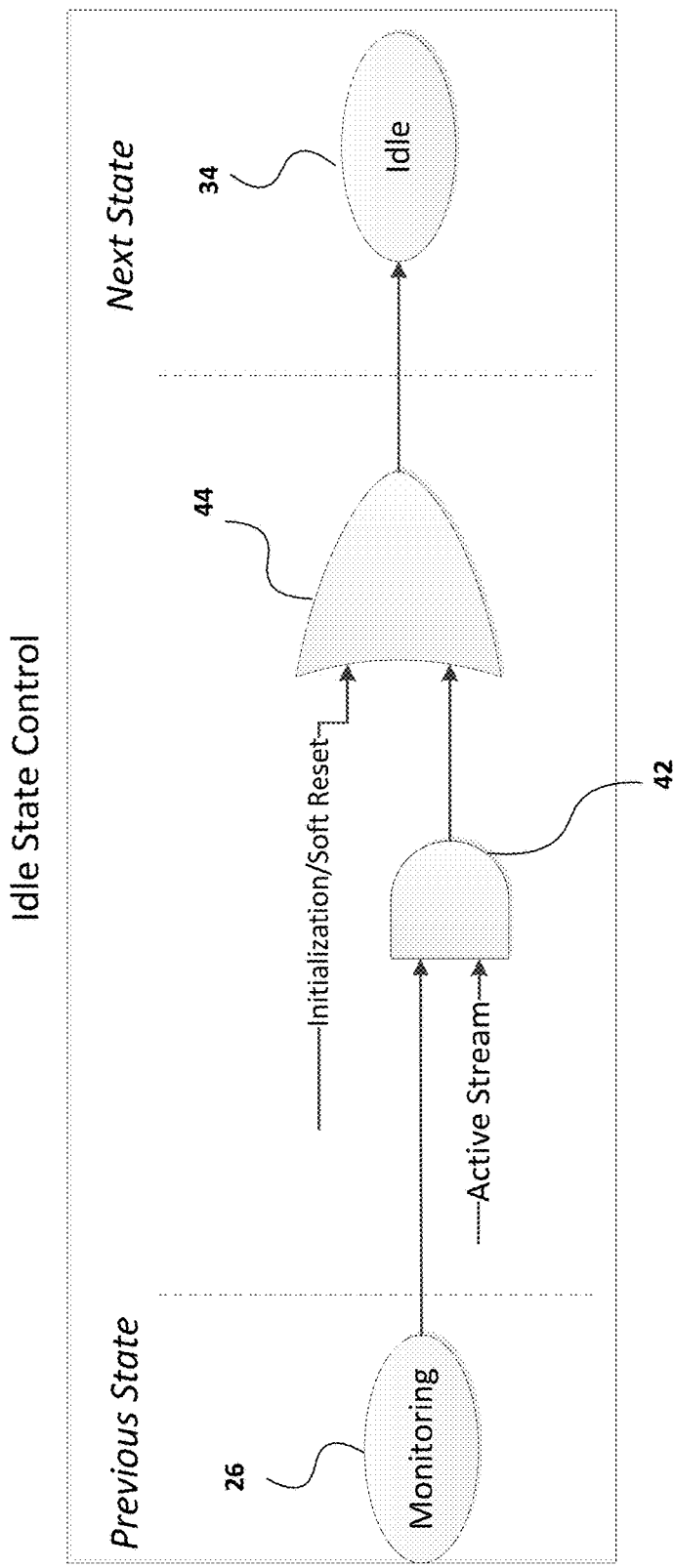
FIG. 3 is a diagram showing the idle state transition control.

FIG. 3 shows the operation of state machine controller 22 to place PLL block 24 into idle state 34. The state machine controller 22 places the PLL block 24 in the idle state 34 if it was previously in the monitoring state 26 and the stream 12 becomes active, meaning incoming packets move from a state where they do not carry valid frequency and timing information to a state where the TSU 14 determines that they carry valid frequency and timing information, or in response to initialization/soft reset from block 38, as indicated by AND gate 42 and OR gate 44.

Figure 4:
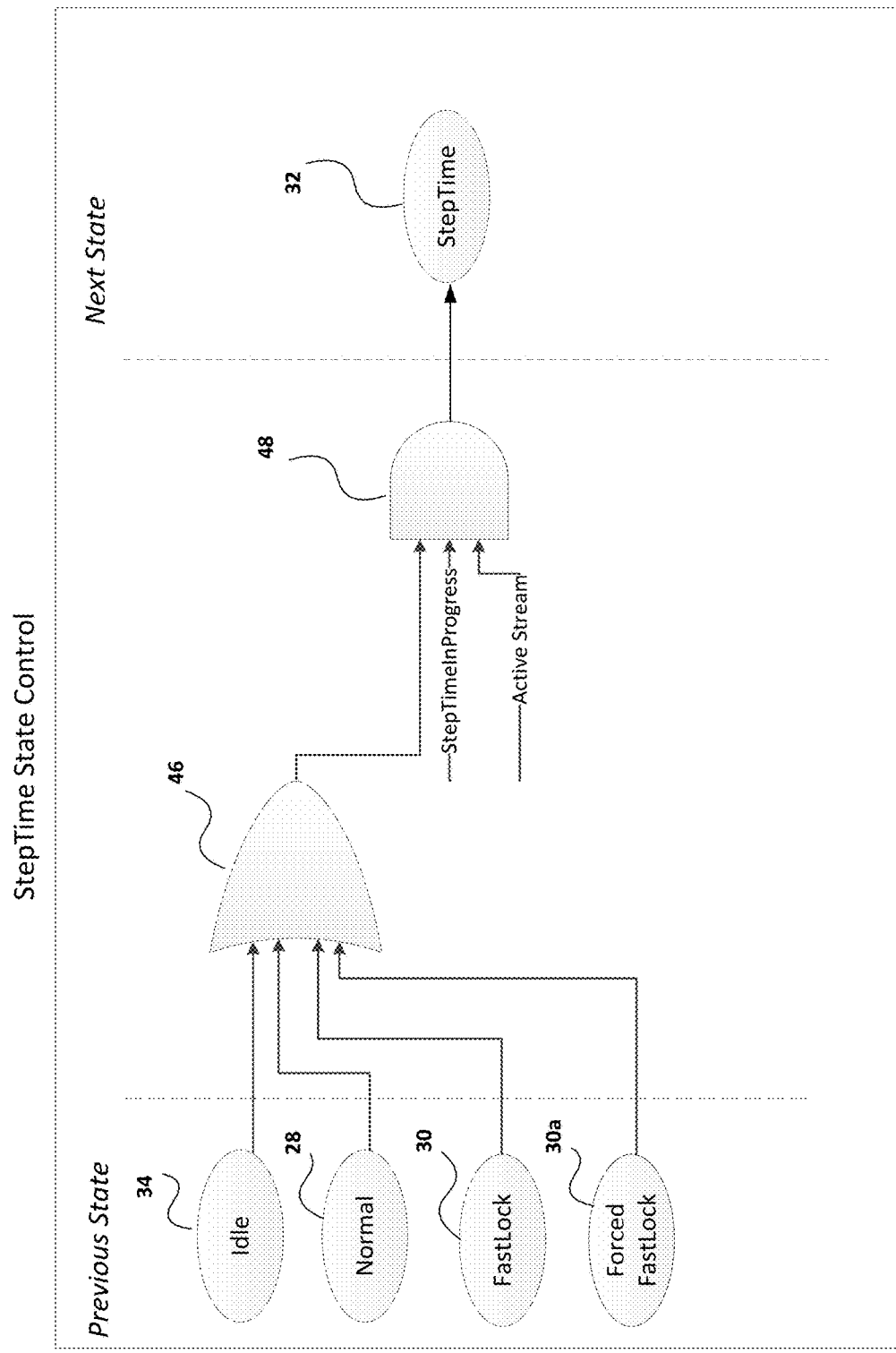
FIG. 4 is a diagram showing the steptime state control.

FIG. 4 shows the operation of state machine controller 22 to place PLL block 24 into StepTime state 32. The state machine controller 22 places the PLL block 24 in the StepTime state 32 when the previous state was idle 34, normal 28, fast lock 30 or forced FastLock 30a (namely any state except the monitoring state) and a StepTimeinProgress flag output by phase jump detector 19 is asserted in the presence of an active stream as indicated by OR gate 46 and AND gate 48. There is a grace period of one interrupt delay between assertion of the StepTimeinProgress flag and state machine controller 22 placing PLL block 24 into StepTime state 32.

The StepInProgress flag is asserted by phase jump detector 19 if a jump in phase greater than a programmable threshold stored in phase jump detector 19, which may, in one non-limiting example, be 3 microseconds, is detected on the active PTP stream.

The StepTimeInProgress flag causes the state machine controller 22 to activate the StepTime( ) block 18 and to place the PLL block 24 in the Steptime state 32. In this state frequency estimation is performed while idling the type II PLL state 28, as described above.

The Steptime( ) block 18 monitors the OFM phase, and if the OFM phase exceeds a larger threshold, for example, 20 microseconds, the Steptime (block 18 increases the step size to reduce the OFM phase offset more rapidly.

Figure 5:
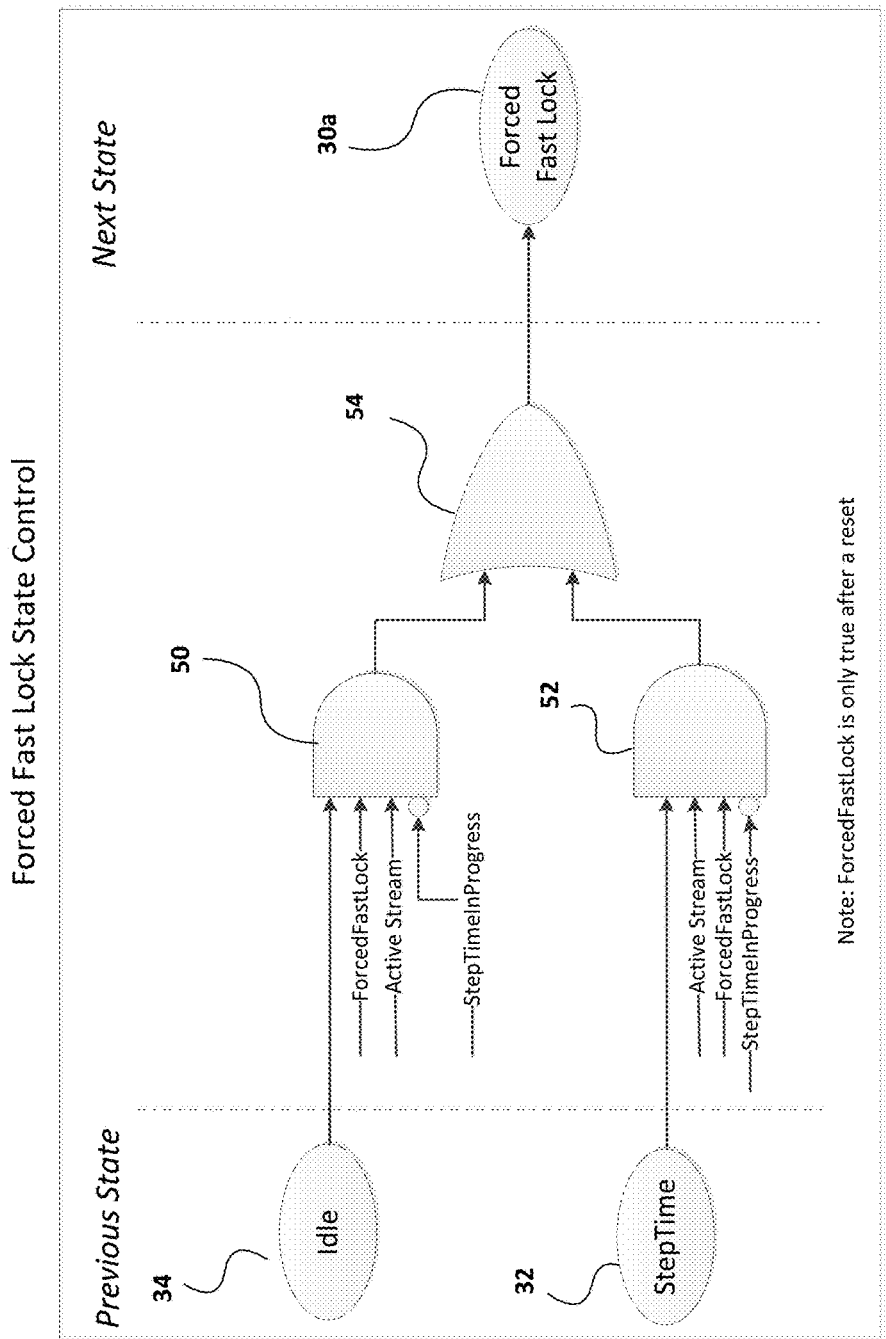
FIG. 5 is a diagram showing the forced fast lock state control.

FIG. 5 shows the operation of state machine controller 22 to place PLL block 24 into optional forced Fastlock state 30a. State machine controller 22 places PLL block 24 into the forced Fast Lock state 30a, if the FastForcedLock feature is enabled by the customer/user by setting a ForcedFastLock flag, only under the following conditions: 1) the previous state was idle state 34, the incoming stream 12 is detected as active by TSU 14, and the phase error is within the StepTime threshold so the StepTimeinProgress flag is not active; or 2)

the previous state was Steptime state 32, the phase error is within the Steptime threshold so the StepTimeinProgress flag is not active, and the incoming stream 12 is active as detected by TSU 14.

The state machine controller 22 thus places the PLL 24 in the forced Fastlock State 30a in the presence of the ForcedFastLock flag if the previous state was either the idle state 34 or steptime state 32 as indicated by OR gate 54, there is an active stream, and StepTime is not in progress, i.e. the StepTimeinProgress flag output by phase jump detector 19 is not asserted, as indicated by the presence of AND gates 50, 52.

Figure 6:
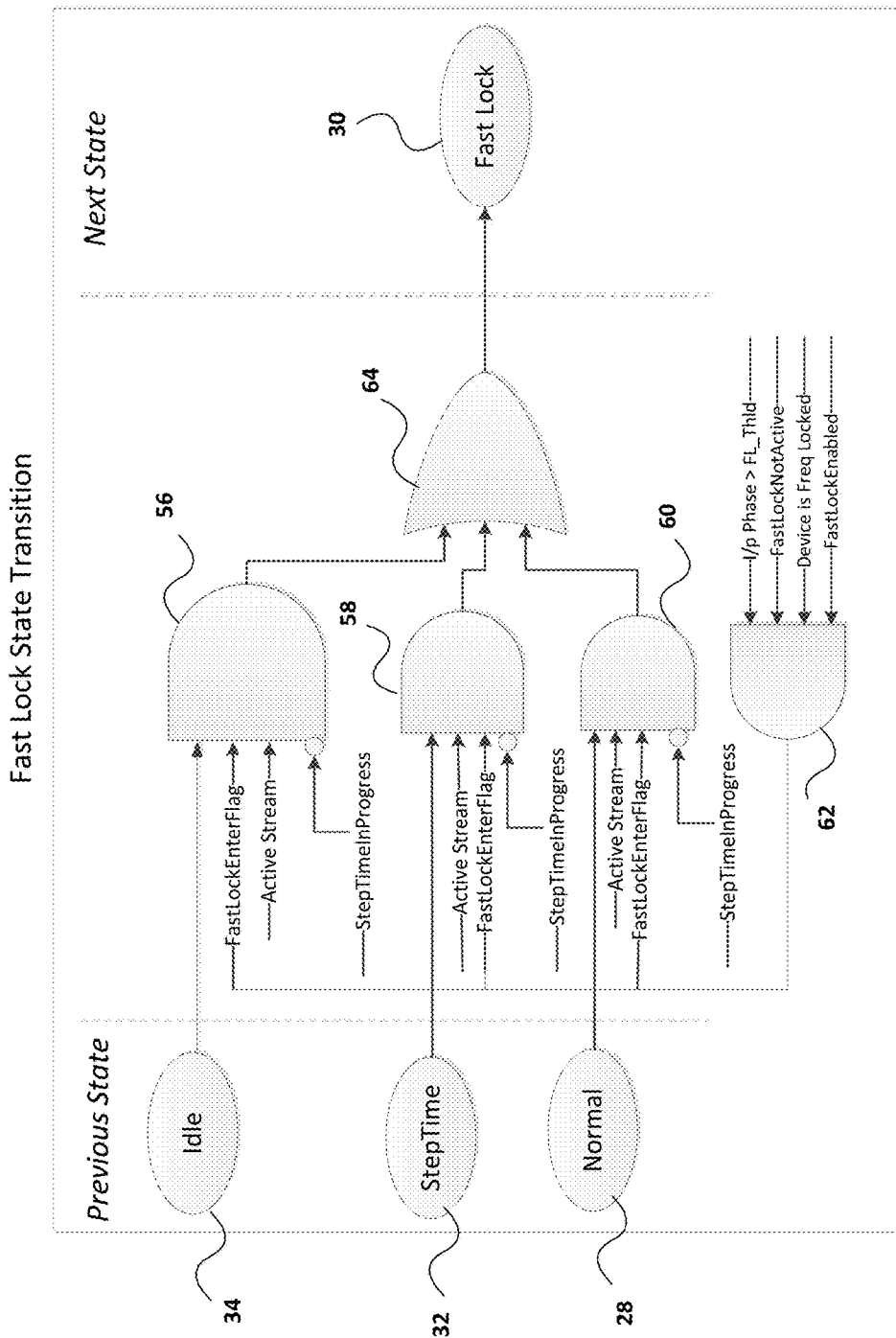
FIG. 6 is a diagram showing the fast lock state control.

The conditions for transitioning to the Fastlock state 30 are shown in FIG. 6 as indicated by the AND gates with an inverting input 56, 58, 60, the AND gate 62 and the OR gate 64.

Fast lock state 30 is entered in the presence of a FastLockEnter flag if the previous state was idle state 34, StepTime state 32, or normal state 28, an active stream is detected by TSU 14 and StepTime is not in progress, i.e. the StepTimeinProgress flag is not asserted.

The FastLockEnter flag is generated by AND gate 62 when FastLockEnabled is asserted, meaning that the user has elected to allow the clock recovery device to enter the Fastlock state when appropriate, the clock recovery device is frequency locked as determined by state machine controller 22, and the input phase is greater than a preset threshold. The input phase is the output of adder 20 in FIG. 1, which is also the same as the input to the integrator Imem 94. There also need to be a FastLockNotActive flag, which is a control flag generated by the state machine controller 22 when the FastLock state 30 is exited. This flag ensures that the FastLock state 30 is not restarted if one of the previous state flags has not cleared.

The state machine controller 22 sets the FastLockinProgress flag when FastLock is active.

FIG. 6 represents the conditions under which a transition occurs to the FastLock state 30 from the idle state 34, the Steptime state 32, and the normal state 28.

Figure 7:
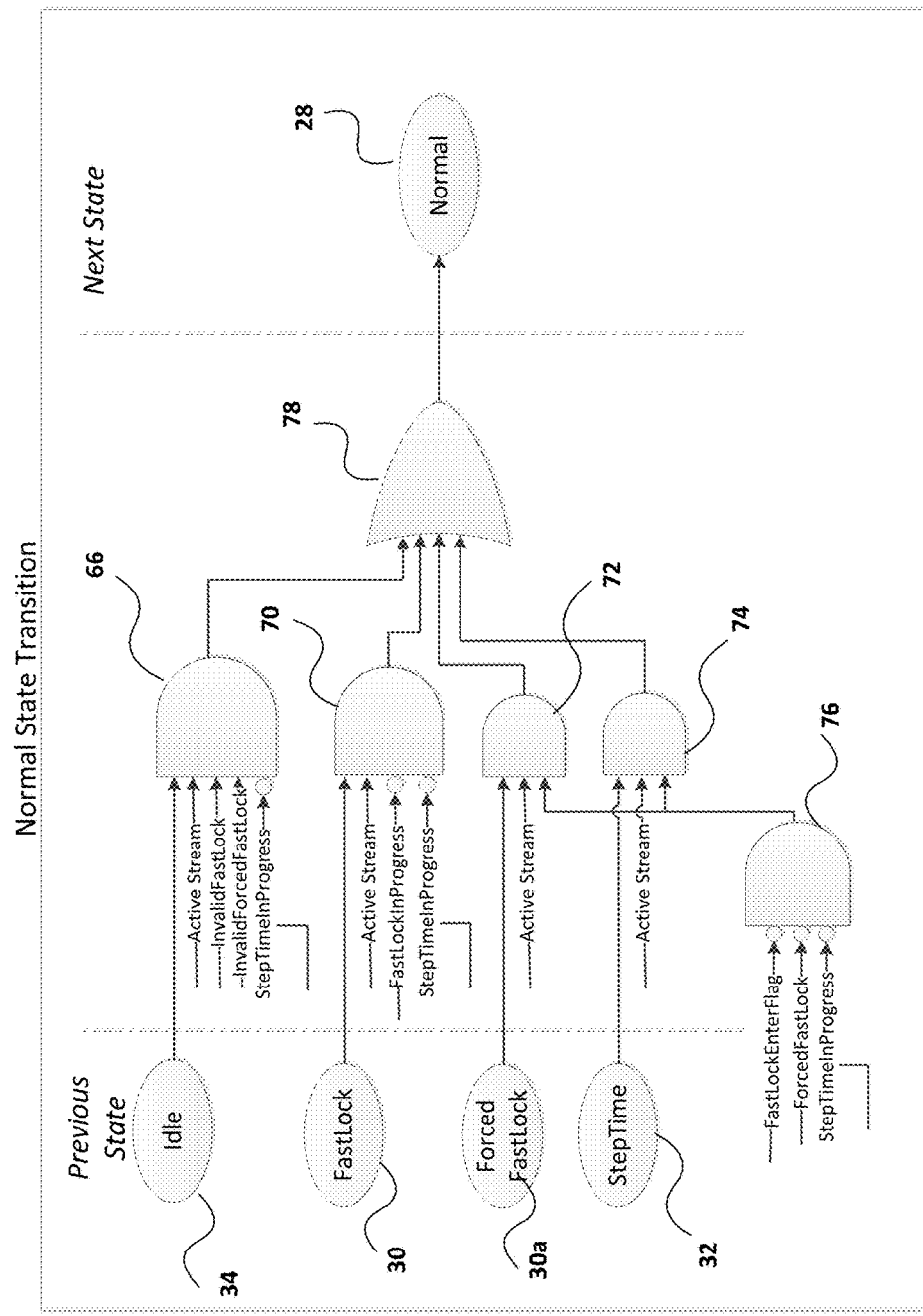
FIG. 7 is a diagram showing the normal state control.

The conditions for transitioning to the normal state 28, i.e. the Type II PLL state 28, are shown in FIG. 7 as indicated by the AND gate 66 with one inverting input, the AND gate 70 with two inverting inputs, the AND gates 72, 74, and the AND gate 76 with three inverting inputs, and the OR gate 78.

The normal state 28 is entered in the presence of an active input stream, as detected by TSU 14, when the previous state was idle 34, FastLock 30, Forced FastLock 30a, or StepTime 32.

In the case of the previous state being idle 34, there also needs to be an invalidFastLock flag and an InvalidForcedFastLock flag. Also, the StepTimeinProgress flag must not be asserted. The state machine controller 22 sets the InvalidFastLock flag when the output of AND gate 70 is TRUE (one) and sets the InvalidForcedFastLock flag when the output of AND gate 72 is TRUE.

The removal of the valid StepTimeinProgress flag results from the OFM phase at the output of OFM block 16 falling below a predetermined threshold as determined by the phase jump detector 19.

If the previous state was FastLock state 30, in order to enter the normal state 28 there needs to be a valid stream detected by TSU 14, and no valid FastLockinProgress flag to ensure that the FastLock state has terminated. In addition, the StepTimeinProgress flag must not be asserted as indicated by the inverting input to AND gate 70.

If the previous state was Forced FastLock 30a or StepTime 32, there needs to be an active stream detected by TSU 14, an invalid FastLockEnter flag, an invalid ForcedFastLock flag, and an invalid StepTimeInprogress flag, as shown by AND gate 76.

Figure 8:
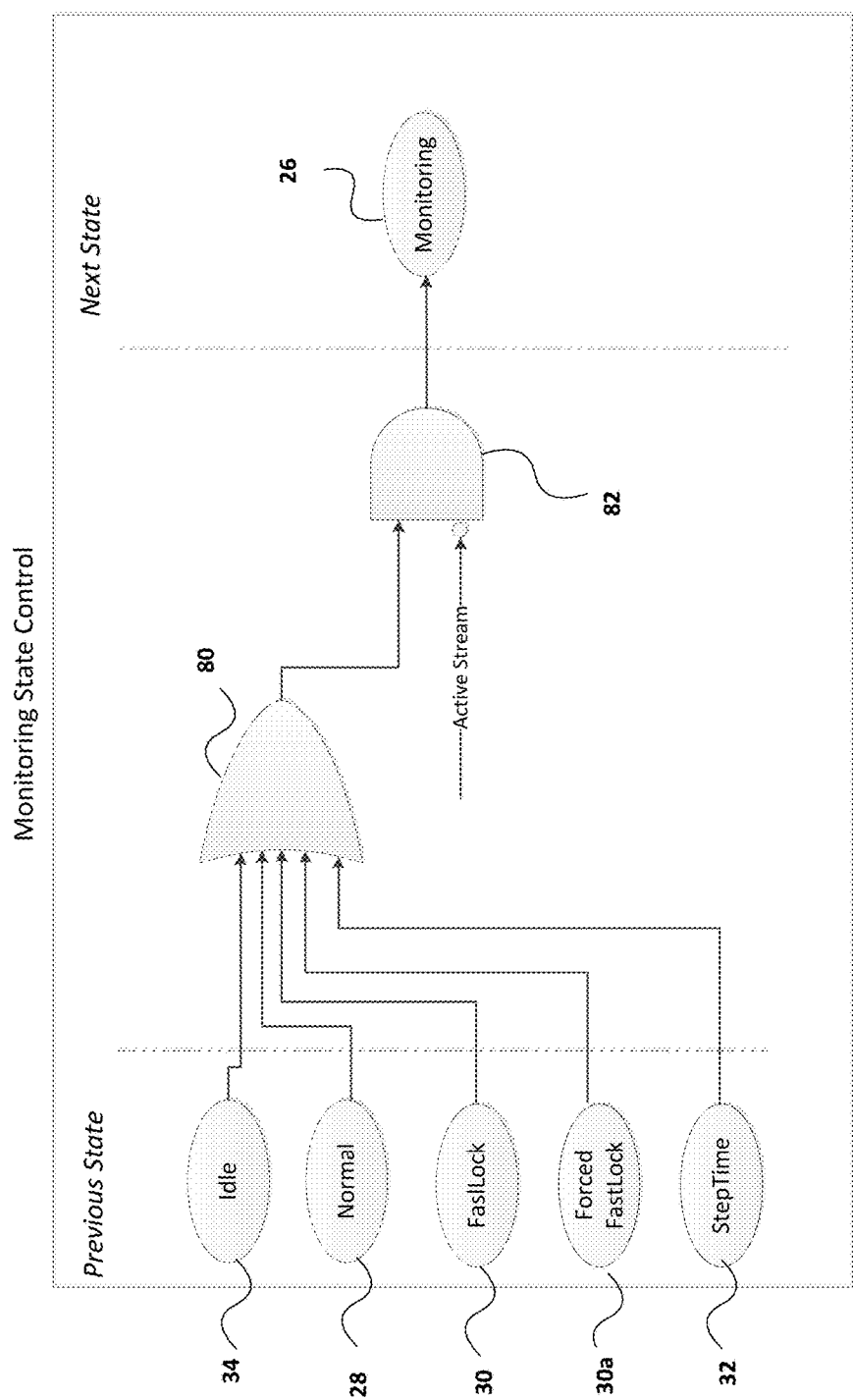
FIG. 8 is a diagram showing the monitoring state control.

Finally, the conditions for transitioning to the monitoring state 26 are shown in FIG. 8 as indicated by the OR gate 80 and the AND gate 82 with one inverting input. The monitoring state 26 is entered in response to the absence of an active stream detected by TSU 14 from any of the idle state 34, normal state 28, fastlock state 30, forced fastlock state 30a or steptime state 32.

As noted above with reference to FIG. 4, the StepTime state 32 is entered either right after startup or upon a phase (time) jump between master and slave nodes. A phase jump can also be caused by frequency offset jump between the master and slave.

Once StepTimeState 32 has been entered, the current frequency difference value DF is saved into the Imem 94 of the Type-II PLL and the type II PLL may halt its computational operations.

Once the StepTimeInProgress flag has been cleared, as noted above, the state machine controller 22 forces the PLL 24 into ForcedFastLockState 30a if the ForcedFastLock flag has been set by the user.

In ForcedFastLockState 30a pre-specified number of phase fast lock rounds are performed to clear the residual input phase to below a programmable threshold. Typically the programmable threshold is defined in ns.

Once Forced fast lock has been achieved, i.e. the residual input phase is below the programmable threshold, the FastLockinProgress flag is cleared and the state machine controller 22 switches the PLL block 24 into the Type-II PLL state 28, in the presence of an active stream, i.e. into the normal mode of operation, as described above in relation to FIG. 7.

As described above in relation to FIG. 8, during any state, if the stream becomes inactive, state machine controller 22 switches PLL block 24 into a fixed 100 mHz filter bandwidth predictive open loop DF estimation mode/filter, which is also called monitoring state 26.

Figure 10:
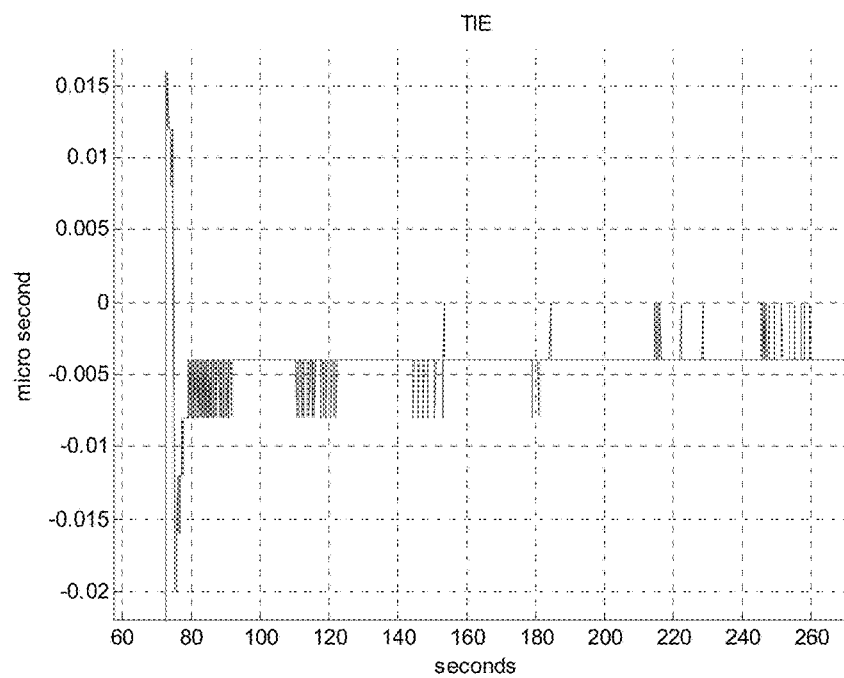
FIG. 10 is a TIE (Time Interval Error) plot showing the phase and frequency lock time with an 85 mHz PLL for a 1.2 ppm and 2.343s initial frequency and time offset.

FIG. 10 is a TIE (Time Interval Error) plot for a clock recovery device in accordance with embodiments of the invention having an initial 1.2 ppm (parts per million) frequency offset and a 2.343 s time offset at time 0 seconds (not shown in the Figure). The Y axis represents the time (phase) offset in microseconds. The X-axis shows the elapsed time (starting at 60 seconds). FIG. 10 shows a fast phase and frequency lock time of 80 s with an 85 mHz PLL bandwidth. The offset and perturbations result from the timestamp resolution, which in this case is +/−4 ns.

Figure 11:
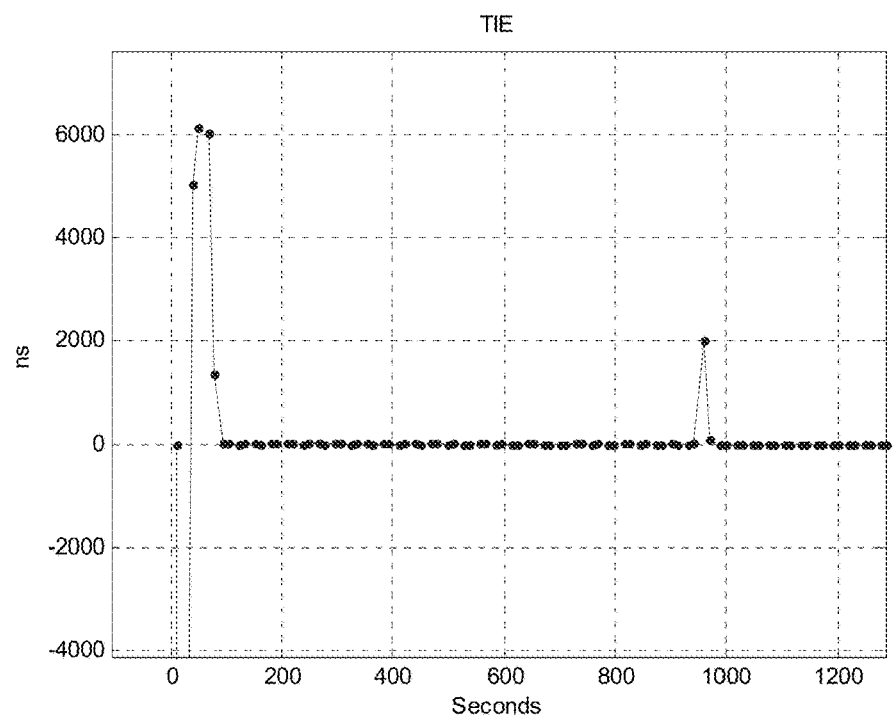
FIG. 11 is a TIE plot showing the phase and frequency lock time with an 85 mHz PLL for a 9.2 ppm and 1.743 s initial frequency and time offset.

FIG. 11 is a TIE (Time Interval Error) plot for a clock recovery device in accordance with embodiments of the invention having an initial 9.2 ppm frequency offset and a 1.743 s time offset. The Y axis is the time (phase) offset in nanoseconds. The X-axis is the elapsed time. FIG. 11 shows a fast phase and frequency lock time of 100 s with an 85 mHz PL bandwidth.

In this example, a phase jump of 2 μs, causing loss of phase lock, for example due to a glitch on the line, occurs at approximately 950 seconds. This is corrected in less than ten seconds using the Fastlock state. Phase lock is generally considered to be achieved when the phase offset is down to within a few nanoseconds, In the absence of the Fastlock state, using the PLL 28, it would typically take about 600 seconds to achieve phase lock.

The fast lock state will now be described in more detail with reference to FIGS. 12 and 13. The proportional part of the loop filter in the type II PLL roughly determines the bandwidth ($f_c$) of the PLL, which has a time constant T equal to $½f_c$. Frequency lock occurs when there is almost no difference (although there can be some residual difference) between the input and output frequencies of the PLL. The sum of the proportional part (P-part) and integrating part (I-part) represents the frequency offset at the input of the PLL. At this point there will still be a phase error between the input and output of the PLL, which may be significant. As a general rule of thumb it has been found that frequency lock occurs at approximately 4.5* the time constant T, which for a 1 mHz bandwidth works out at approximately 716 seconds.

It takes longer to achieve phase lock, which will be obtained when there is almost no phase difference between the input and output of the PLL. When phase lock is achieved the contribution of the P-part is on average zero (subject to some jitter), and the I-part compensates for the frequency offset of the input signal. In effect, in the time between frequency lock and phase lock, the remaining phase error (represented by the output of the P-part) is slowly transferred to the I-part.

The idea of the fast lock state is to shorten the time it takes to achieve full lock by taking the place of the normal PLL loop to adjust the frequency of the NCO 36 directly.

Figure 12:
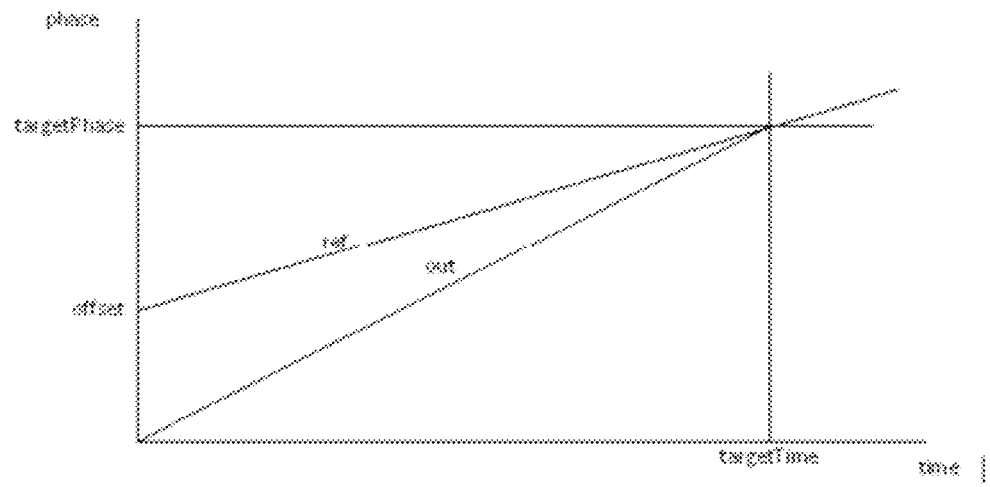
FIG. 12 is a plot showing the desired phase convergence between the master and slave plotted against time.
Figure 13:
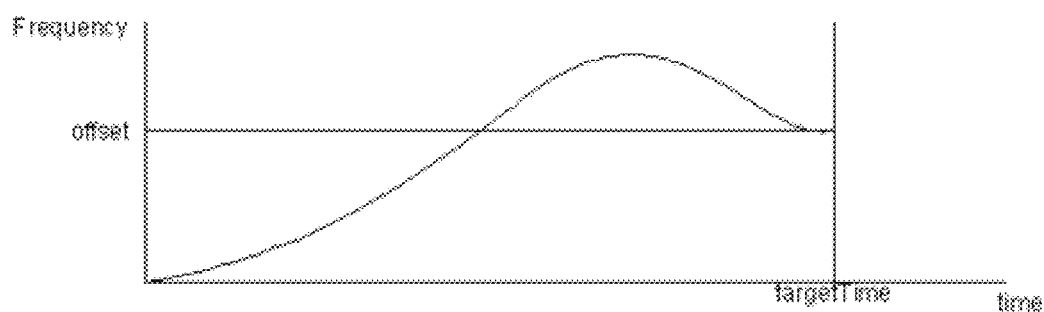
FIG. 13 shows the frequency response of the fast lock state.

The concept is illustrated in FIG. 12. At start the input (ref) begins with a phase offset relative to the output of the NCO 36, as indicated by the phase separation on the Y-axis of the line ref (input) signal and the line out (output signal). At start, the input ref will also have a frequency offset relative to the output of the NCO 36, which is represented by the slope of the line ref. At a predetermined targetTime, the output phase of the clock recovery device out should be equal to the input phase ref. Continuing the line ref to targetTime enables the phase of the input ref to be estimated at targetTime.

In the fast lock state, after determining the phase of the input ref at targTime, the frequency of the NCO 36 is set such that the lines ref and out meet at targetTime. The frequency response in the fast lock state is as shown in FIG. 13.

Typically, once Fastlock is engaged, the process continues for a specific minimum time limit computed based on the smaller value of (125 ms*Initial_phase/PSL), where Initial_phase is the initial phase offset and PSL is the predetermined phase slope limit, or 12.5 seconds. Either way, the Fastlock process stops, in this non-limiting example, if the input phase is less than or equal to 8 ns, which in one embodiment is a default for a programmable threshold value.

It should be appreciated by those skilled in the art that any block diagrams herein represent views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor. As an "adder" can have a negative input it can course also function as a subtractor if so indicated.

The invention claimed is:

1. A clock recovery device for recovering frequency and timing information from an incoming packet stream over asynchronous packet networks, comprising:
    a phase locked loop (PLL) block having a plurality of predefined states, said PLL block including a type II PLL, one of said states including type II PLL operation;
    a state machine controller for controlling the transition between said predefined states in response to changes in the incoming packet stream; and
    a controlled oscillator responsive to said PLL block for generating an output signal.

2. The clock recovery device of claim 1, further comprising a phase interface block receiving said incoming packet stream, and a StepTime block, said StepTime block arranged to align time/phase information in the controlled oscillator within a programmable threshold to the incoming packet stream before the PLL block starts locking operation to the incoming packet stream, said phase interface block controlling the StepTime block.

3. The clock recovery device of claim 2, wherein the phase interface block comprises a time stamp unit arranged to receive incoming time stamped packets in said incoming packet stream and create delay request time stamped packets from an output of said controlled oscillator, and an offset-from-master (OFM) block for determining an OFM phase to control said StepTime block.

4. The clock recovery device of claim 3, further comprising a subtractor for subtracting an output of said StepTime block from said determined OFM phase to provide a control input to said state machine controller.

5. The clock recovery device of claim 3, further comprising a phase jump detector responsive to said OFM phase to assert a StepTimeinProgess flag upon detection of said OFM phase exceeding a StepTime threshold.

6. The clock recovery device of claim 5, wherein said StepTime threshold is programmable.

7. The clock recovery device of claim 5, wherein said state machine controller transitions said PLL block to the StepTime state in response to a predetermined condition that comprises the presence of an active incoming packet stream and the assertion of said StepTimeinProgress flag.

8. The clock recovery device of claim 7, wherein said predefined states include a monitoring state wherein statistical estimation of accumulated phase is performed using another active packet stream.

9. The clock recovery device of claim 8, wherein said predetermined condition also comprises said PLL block having a previous state that is not said monitoring state.

10. The clock recovery device of claim 8, wherein said state machine controller transitions said PLL block to type II PLL operation in the presence of an active stream and upon the removal of said StepTimeinProgress flag due to said OFM phase falling under said StepTime threshold.

11. The clock recovery device of claim 10, wherein said type II PLL comprises a loop filter with an integrator block containing an integrator memory, and upon exit of the PLL block from said StepTime state, the current output of said PLL block is loaded into said integrator memory.

12. The clock recovery device of claim 11, wherein one or more additional said states are selected from the group consisting of: fast lock, forced fast lock, and idle.

13. A computer implemented method of recovering frequency and timing information from an incoming packet stream over asynchronous packet networks, comprising:
   providing a phase locked loop (PLL) block having a plurality of predefined states, said PLL block including a type II PLL, one of said states including type II PLL operation;
   controlling the transition between said predefined states in response to changes in the incoming packet stream; and
   generating an output signal with a controlled oscillator responsive to said PLL block.

14. The method of claim 13, wherein during a StepTime state, time/phase information in the controlled oscillator is aligned to said incoming packet stream to within a programmable threshold before the PLL block starts locking operation to the incoming packet stream.

15. The method of claim 14, wherein an offset-from-master (OFM) phase is computed from incoming time stamped packets in said incoming packet stream and outgoing delay request time stamped packets created from an output of said controlled oscillator.

16. The method of claim 15, further comprising asserting a StepTimeinProgess flag upon detection of said OFM phase exceeding a predetermined StepTime threshold.

17. The method of claim 16, further comprising transitioning said PLL block to the StepTime state in response to a predetermined condition that comprises the presence of an active incoming packet stream and the assertion of said StepTimeinProgress flag.

18. The method of claim 17, wherein said predefined states include a monitoring state wherein statistical estimation of accumulated phase is performed using another active packet stream and said predetermined condition also comprises said PLL block having a previous state that is not said monitoring state.

19. The method of claim 18, further comprising transitioning the type II PLL operation state in the presence of an active stream and upon the removal of said StepTimeinProgress flag due to said OFM phase falling under said StepTime threshold.

20. The method of claim 19, further comprising loading the current output of said StepTime block is loaded into an integrator memory of said type II PLL upon exit from said StepTime state.

* * * * *